(12) United States Patent
Nelson et al.

(10) Patent No.: US 6,815,740 B2
(45) Date of Patent: Nov. 9, 2004

(54) GATE FEED STRUCTURE FOR REDUCED SIZE FIELD EFFECT TRANSISTORS

(75) Inventors: Stephen R. Nelson, Springfield, MO (US); Gregory T. Clark, Dallas, TX (US); Dean R. White, Plano, TX (US)

(73) Assignee: Remec, Inc., Delmar, CA (US)

( * ) Notice: Subject to any disclaimer, the term of this patent is extended or adjusted under 35 U.S.C. 154(b) by 22 days.

(21) Appl. No.: 10/158,265

(22) Filed: May 29, 2002

(65) Prior Publication Data

US 2003/0085428 A1 May 8, 2003

Related U.S. Application Data

(60) Provisional application No. 60/295,207, filed on Jun. 1, 2001.

(51) Int. Cl.[7] .................. H01L 29/80; H01L 31/112
(52) U.S. Cl. .................. 257/275; 257/288; 257/341; 257/401
(58) Field of Search .................. 257/275, 288, 257/341, 401

(56) References Cited

U.S. PATENT DOCUMENTS

| 4,947,136 A | 8/1990 | Helms .................. 330/54 |
| 6,081,006 A | 6/2000 | Nelson .................. 257/276 |

OTHER PUBLICATIONS

Hirota and Muraguchi, "K–Band Frequency Up–Converters Using Reduced–Size Couplers and Dividers", NTT Radio Communication systems Laboratories, IEEE, 1991, pp. 53–56.

Ross, Michael B., "Investigation of Taper and Forward–Fee in GaAs MMIC Distributed Amplifiers", Ottawa–Carleton Institute for Electrical Engineering, Jun., 1987, p. 1–242.

Lim, et al, "A Power Amplifier with Efficiency Improved Using Defected Ground Structure", IEEE Microwave and Wireless Components Letters, vol. 11, No. 4, Apr. 2001, p. 170–172.

Das, Mukunda B., "Heterostructure Field–Effect Transistors (HFET's): Structures, Electronic Parameters, Performance and Limits", The Pennsylvania State University, p. 461–467.

Virdee et al, "Amplifier Design for High Efficiency Performance", The Institution of Electrical Engineers, IEE, London, 2000, p. 1–7.

Nguyen and Micovic, "The State–of–the–Art of GaAs and InP Power Devices and Amplifiers", IEEE Transactions on Electron Devices, vol. 48, No. 3, Mar., 2001, p. 472–477.

Zanoni, et al., "Factors Limiting the Maximum Operating Voltage of Microwave Devices", International Journal of High Speed Electronics and Systems, vol. 10, No. 1, 2000, p. 119–128.

Jack Browne, "More Power Per Transistor Translates into Smaller Amplifiers", Microwaves & RF, Jan. 2001, p. 132, 134, 136, & 160.

Giannini, et al, "A Closed–Form Synthesis Procedure for Wideband Matching in Microwave FET Amplifier Design", Microwave and Optical Technology Letters, vol. 28, No. 2, Jan., 2001, p. 116–121.

Bessemoulin, et al., "Ka–Band High–Power and Driver MMIC Amplifiers Using GaAs PHEMTS and Coplanar Waveguides", IEEE Microwave and Guided Wave Letters, vol. 10, No. 12, Dec. 2000, p. 534–536.

(List continued on next page.)

Primary Examiner—Thien F Tran
(74) Attorney, Agent, or Firm—Jenkens & Gilchrist PC.

(57) ABSTRACT

A FET or BJT structure or distributed transistor amplifier having a tapered gate feed line and a tapered channel width (tapered source fingers, tapered drain fingers) provides increased bandwidth and gain in the microwave/mm-wave frequency spectrum.

26 Claims, 6 Drawing Sheets

OTHER PUBLICATIONS

Eccleston, K.W., "Output Power Performance of Dual–Fed and Single–Fed Distributed Amplifiers", Microwave and Optical Technology Letters, vol. 27, No. 4, Nov., 2000, p. 281–284.

Kim, et al, "Gate Layout and Bonding Pad Structure of a RF n–MOSFET for Low Noise Performance", IEEE Electron Device Letters, vol. 21, No. 12, Dec. 2000, p. 607–609.

Schwierz, Frank, "Microwave Transistors—The Last 20 Years (Invited)", IEEE 2000, p. D28–1–D28–8.

Tarui, et al, "Calculation of Loop Oscillations of Microwave High–Power Amplifiers with Several Closed Loop Circuits and Split–Cell Matching Methods for a High Stability", Electronics and Communications in Japan, Part 2, vol. 83, No. 8, 2000, p. 33–42.

Grebennikov, Andrey V., "Effective Circuit Design Techniques to Increase MOSFET Power Amplifier Efficiency", Microwave Journal, Jul. 2000, p. 64–72.

Green, et al., "Cascode Connected AlGaN/GaN HEMT's on SiC Substrates", IEEE Microwave and Guided Wave Letters, vol. 10, No. 8, Aug. 2000, p. 316–318.

Kopp, et al., "Thermal Design Considerations for Wide Bandgap Transistors", Microwave Journal, vol. 23, No. 6, Jun. 2000, p. 110–114.

end of bar
12 um wide line

Tapered 12 to 22 um

Tapered 22 to 12 um end of bar
22 um wide line

Stair Step 22 to 34 um

GATE FEED STRUCTURE FOR REDUCED SIZE FIELD EFFECT TRANSISTORS This application claims the benefit of Provisional Application No. 60/295,207 filed Jun. 1, 2001.

BACKGROUND OF THE PRESENT INVENTION

1. Field of the Invention

The present invention relates generally to reduced size field-effect transistor (FET) structures and to bipolar junction transistor (BJT) structures. More particularly, the present invention relates to reduced size FET with distributed gate feeds having tapered manifolds or junctions as well as BJTs having tapered manifolds or junctions

2. Description of Related Art

It is known in the art that high frequency FETs and BJTs, that are reduced in size and have distributed gate feeds, have certain characteristics. Reduced size FETs with distributed gate feeds are analogous to very small distributed amplifiers. As RF energy travels down the gate feed structure of the FET, the RF energy is attenuated and shifted in phase. An attenuation and phase shift means that there is a magnitude and a phase difference between the wave (field) entering the FET gate feed (manifold) and the wave field at the end of the FET gate feed (manifold). The attenuation and phase shift can degrade the combining performance of the FET structure at high frequencies. The attenuation and phase shift also limits a FET's gain, power, and efficiency performance at high frequencies. The attenuation and phase shift also limits the upper operating frequency of the FET (or BJT)

What is needed is a reduced sized FET structure with distributed gate feeds that overcomes the high frequency performance and degradation limitations of FETs. What is also needed is an improved BJT structure that operates well in high power or high frequency situations.

SUMMARY OF THE INVENTION

The present invention provides reduced size field effect transistor (FET) and a reduced size bipolar junction transistor (BJT) that operate at high frequencies with improved performance and less degradation than previous FETs and BJTs. The present invention provides advantages that overcome previous problems related to reduced size FET structures with distributed gate feeds that have gain, power, efficiency and upper frequency performance limitations wherein the limitations are caused by attenuation along the distributed gate feed, and by phase differences along the input gate feed and along the output drain feed lines.

Embodiments of the present invention provide, a new reduced size FET gate feed structure which tapers both the gate feed line, also called a bar or manifold, and the attached gate finger widths (FET channel widths). The gate feed line is tapered with novel minor changes to reduce the FET size, layout and area. This novel gate feed structure efficiently compensates for attenuation and phase shift in the exemplary reduced size FET structure, improving the reduced sized FET's maximum available gain performance by 1–2 dB at millimeter (mm) wave frequencies. The novel gate feed structure increases the upper operating frequency of the reduced size FET by up to 5 GHz, for instance, from 40 GHz to 45 GHz. Furthermore, the invention provides embodiments with other features and advantages in addition to or in lieu of those discussed above. Such features include, but are not limited to a tapered channel width, tapered source finger widths and tapered drain finger widths. Many of these features and advantages are apparent from the description below with reference to the following drawings

BRIEF DESCRIPTION OF THE DRAWINGS

The disclosed invention will be described with reference to the accompanying drawings, which show important sample embodiments of the invention and which are incorporated in the specification hereof by reference, wherein.

Figure 1:
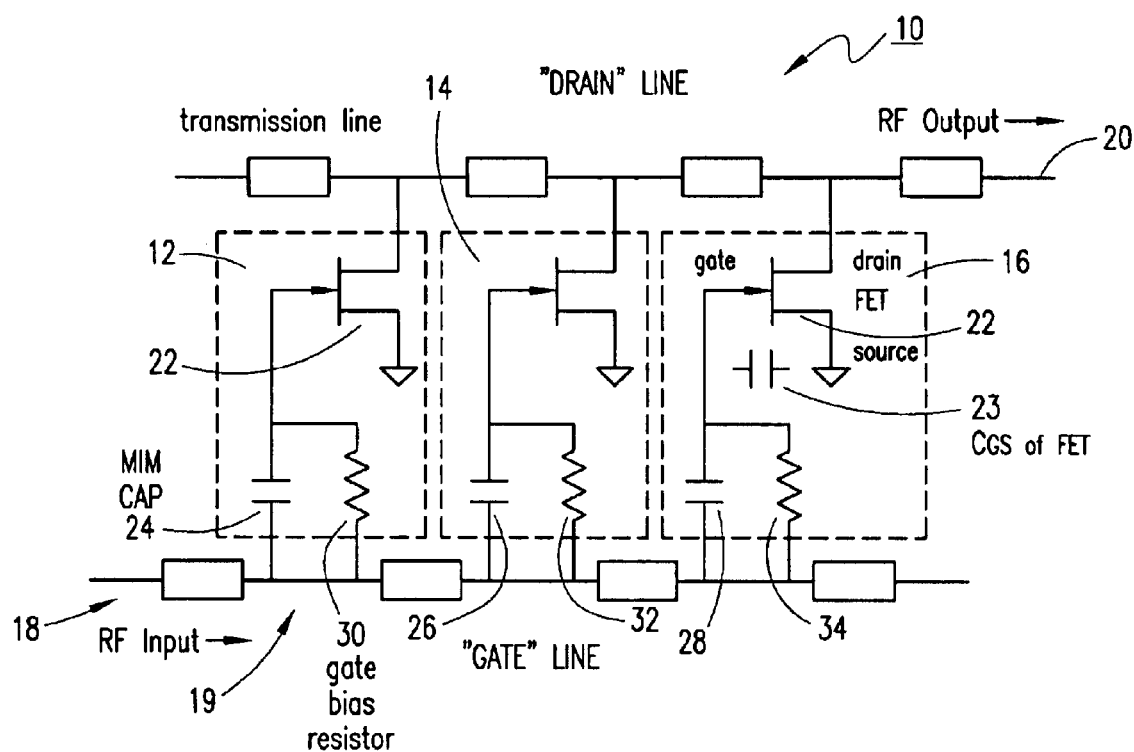
FIG. 1 is a distributed amplifier schematic having gate line capacitive voltage dividers.

DETAILED DESCRIPTION OF THE PRESENTLY PREFERRED EXEMPLARY EMBODIMENTS OF THE PRESENT INVENTION

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others As described in more detail below, an exemplary FET structure in accordance with the present invention offers at least a 1- to 2-db higher gain than previously known FET structures at mm-wave frequencies. Such previously known FET structures include the FET structure described in U.S. Pat. No 6,081,006 (the '006 FET), which is incorporated herein by reference. A 1- to 2-db higher gain represents an improvement of 15–20% in overall amplifier gain for mm-wave amplifiers. This is achieved with novel, but minor, changes to FET layout and area. An exemplary FET structure also will operate several GHz higher in frequency than the '006 FET, and achieve higher output power and efficiency than the '006 FET. This performance improvement is critical in developing higher gain, power, and efficiency mm-wave radio transmitters.

An exemplary gate feed (manifold) structure reduces the size of FETs (or BJTs) and efficiently compensates for both attenuation along the gate feed line, and for phase differences along the line and between the gate and drain lines. The advantages of the present invention are achieved, at least in part, by tapering the main gate feed line (bar or manifold) of the FET, adjusting the impedance of this line from feed input to feed end. In addition, the channel widths (effective gate widths) of the FET channels from gate feed input to feed end are tapered. Adjusting both the line impedance of the gate feed and the width of the gate feed (manifold) and therefore input impedance of the FET channels enables increased FET gain and power at mm-wave frequencies, and increases the upper operating frequency of the FET The exemplary gate feed structure for reduced size FETs provides a FET gain improvement of 1–3 dB at mm-wave frequencies in the 20 to greater than 80 GHz range (gain range of about 5 to 20 dB or higher), and increases the upper operating frequency of such FETs by 5 GHz or more to an upper operating frequency of about 80 GHz or higher. The exemplary gate feed structure and associated gain improvement enables larger gate width, higher output power reduced size FETs to be operated at mm-wave frequencies, with higher gain and power levels, and higher amplifier efficiency. The improved gate feed structure also enables higher power transmitter amplifiers to be built and operated at mm-wave frequencies. Such power amplifiers will increase the range of high data rate wireless radios. Higher power and more efficient mm-wave radar transmitters may also be built using these new FET structures.

Capacitive voltage dividers are used in high power distributed amplifiers to help equalize gate voltages at FET stages along the line. The capacitive voltage dividers are also used to increase the amplifier's bandwidth. An exemplary distributed amplifier 10 schematic with gate line capacitive voltage dividers is shown in FIG. 1. The distributed amplifier 10, as shown, incorporates three amplifiers 12, 14, and 16. The amplifiers 12, 14, 16 are effectively connected in parallel with each other between the RF input 18 and the RF output 20. Each of the exemplary amplifiers 12, 14, and 16 comprise an FET transistor 22. For example in amplifier 12, the drain of the FET 22 is connected to the RF output 20. The source of FET 22 is connected to ground. Each FET 22 has its gate connected to a capacitive divider that comprises a metal-insulator-metal (MIM) capacitor 24, 26, 28 and the FET's gate-source capacitance Cgs 23. The gate is also connected to a bias resistor 30 that is in parallel with the MIM capacitor 24. The capacitive voltage divider circuit (MIM capacitor and bias resistor) is utilized to equalize RF voltages at the FET gates, and gate bias resistors 30, 32, 34. As RF signal travels down the "gate" line 19, the MIM capacitors 24, 26, 28 increase in value. Near the distributed amplifier's RF input 18, the MIM capacitors are relatively small in value; the capacitors' values increase in a "tapered" fashion as each amplifier 12, 14, 16 is farther away from the RF input. The MIM capacitor 24, 26, 28 values are adjusted to provide nearly the same voltage at each FET gate input along the gate line 19. The increase in capacitive value of the MIM capacitors 24, 26, 28 compensates for attenuation of the RF signal as it travels down the RF gate line 19. The biasing resistors 30, 32, and 34, which are placed in parallel with each MIM capacitor 24, 26, 28, provide gate bias to each FET 22 gate. It is understood, that there can be substantially any number of amplifiers 12, 14, 16 in a distributed amplifier 10.

Figure 2:
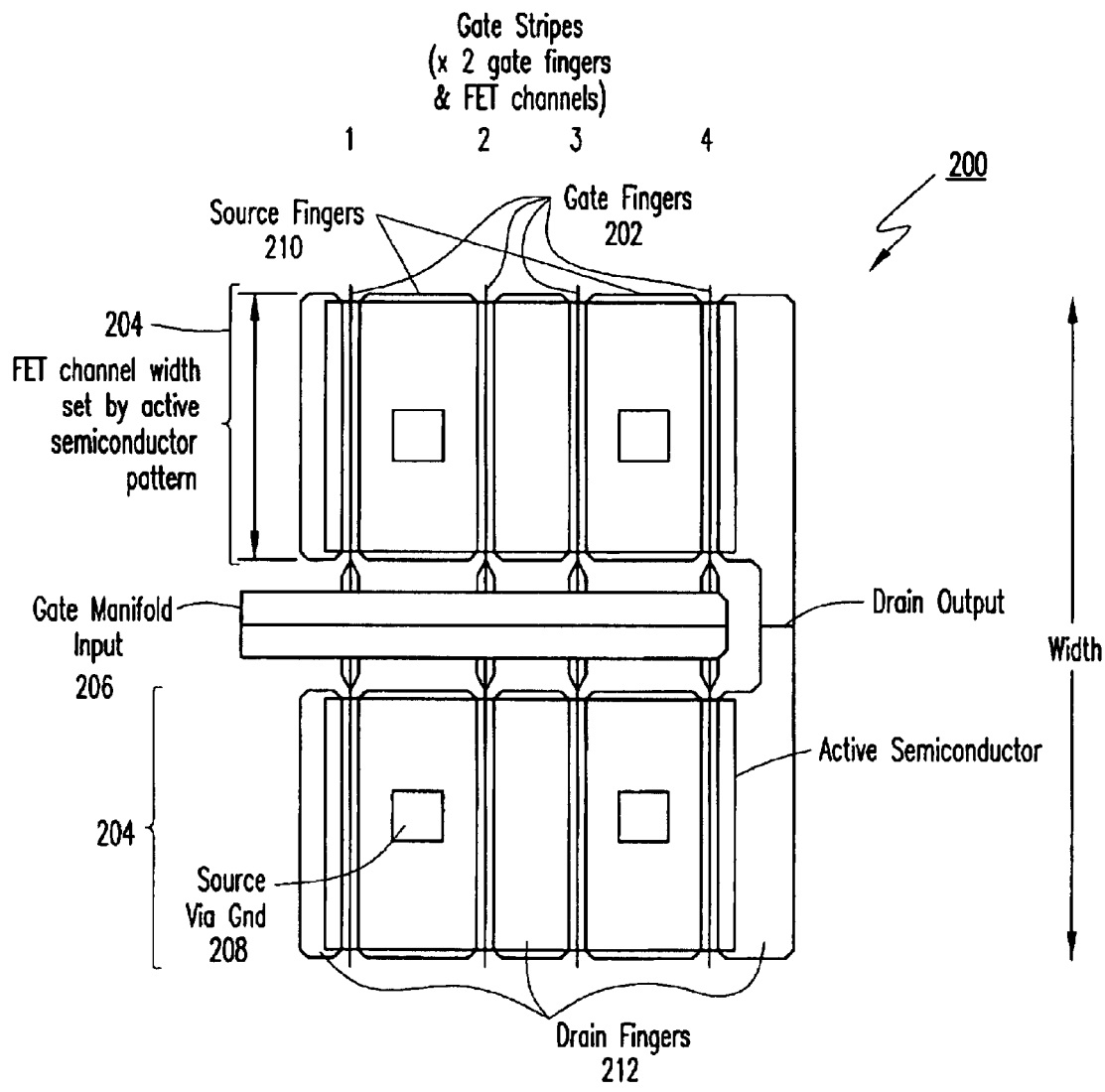
FIG. 2 is a standard prior art reduced size FET structure layout.

A prior art reduced size FET structure is depicted in FIG. 2. The FET structure 200 depicted shows a four-stripe reduced size FET with eight gate fingers and eight FET channels. The gate manifold (gate feed) 206 is a rectangular metal shape (strip line) configuration. The depicted FET structure 200 also contains four small via grounds 208, four source fingers 210 and six drain fingers 212. The reduced size FET structure 200 is made up of very small transistors and contains multiple FET channels 204 having a continuous width. It is understood that placing a discrete MIM capacitor in series with each FET channel 204 (at the gate finger) transistor of the overall FET structure 200 is impractical due to the small transistor size and cost constraints. For example, placing a MIM capacitor in series with each FET channel will multiply the area (size) of the device (and cost) required by the overall FET structure by a factor of three or more. Furthermore, additional cost is incurred because there must be a biasing resistor placed in parallel with each MIM capacitor to provide gate bias to each FET channel. The biasing resistors would also increase the overall FET structure area requirements In an exemplary embodiment of the present invention, instead of utilizing voltage dividers, as discussed above with the MIM capacitor and resistor elements, the gate manifold's characteristic impedance is adjusted over its length. The gate manifold's characteristic impedance is adjusted by reducing or tapering the gate manifold over its length. Furthermore, the gate fingers, which are fed by the gate manifold, can have their individual finger widths adjusted in order to adjust the voltage magnitude and the phase of a single of each FET channel. The finger width of a gate finger is the distance between the gate manifold and the end of the gate finger. The finger width is directly related to the channel width. An exemplary FET structure that utilizes a tapered gate manifold and/or adjusted FET gate finger channel widths has higher gain and higher operating frequency capability than prior FET structures. Furthermore, the exemplary FET structure can operate at higher power and efficiency over a wider frequency range than prior FET structures.

In previous distributed transistor structures, of which there are several examples, gate, drain and source line impedances were adjusted by altering the line lengths (e g, gate manifold length) of each in an attempt to maintain proper phasing and combining of RF energy traveling and being amplified from the FET input to the FET output as well as an attempt to achieve a wider operating frequency and performance. These previous FET structures were larger and longer than those prescribed by the exemplary embodiments of the present invention.

Figure 3:
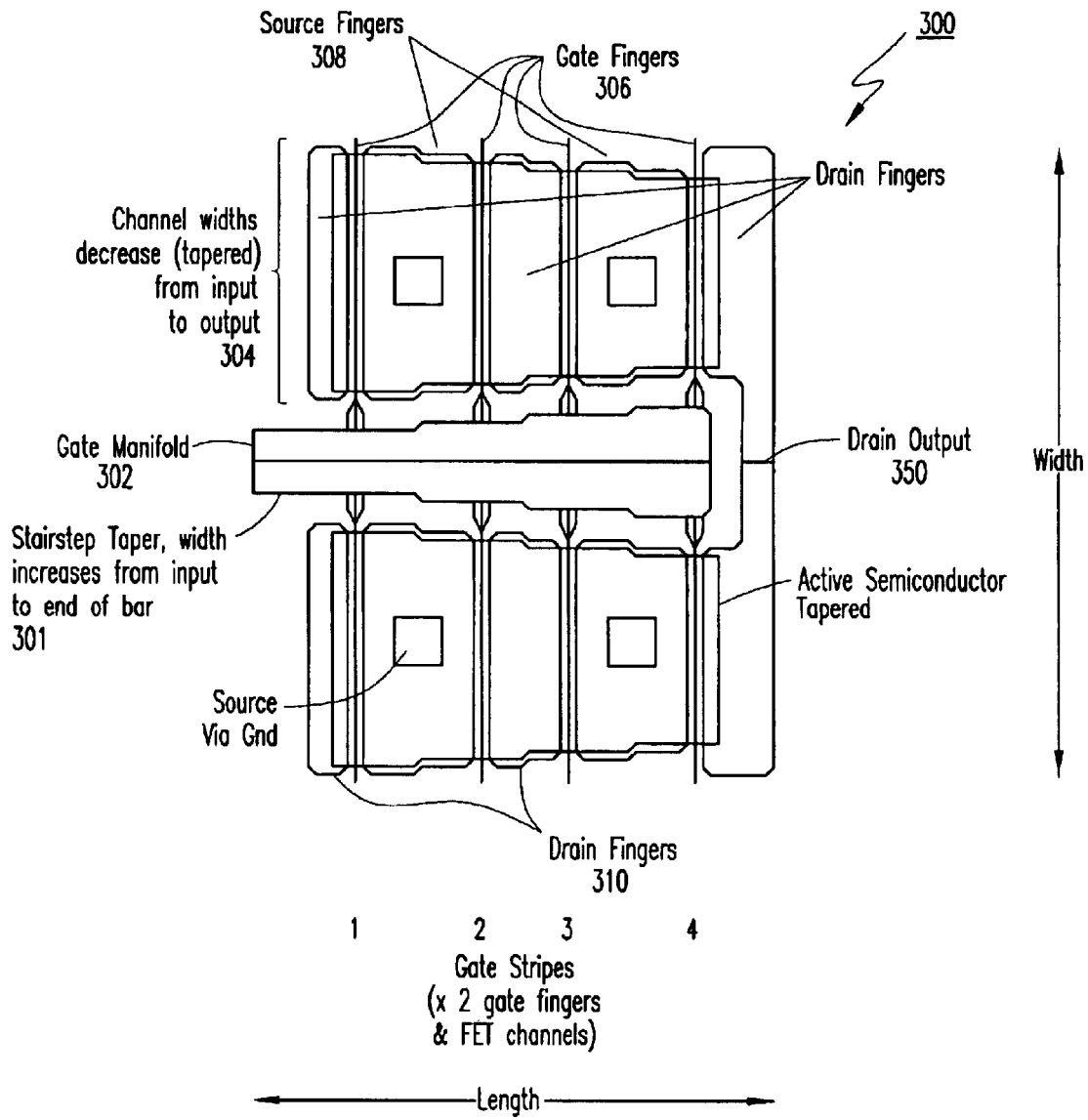
FIG. 3 is a reduced size FET structure with tapered gate bar impedance and tapered gate finger widths in accordance with an embodiment of the present invention.

The present exemplary embodiments of the reduced size FET structure allows the resulting FET structure to be smaller than earlier distributed transistor structures. Significant gate, drain, or source line lengths are not used in the exemplary FET structures. In fact, exemplary FET structures in accordance with the present invention achieve greatly improved reduced size FET performance with either no area change or very slight (a few percent) area change and with minor changes to the overall FET layout An exemplary higher gain and operating frequency reduced size FET structure with a tapered gate feed (manifold) and tapered gate finger widths is shown in FIG. 3. FIG. 3 can easily be compared against the standard, prior art, reduced size FET shown in FIG. 2. In particular, the reduced size FET structure 300 of FIG. 3 depicts a four-stripe reduced size FET structure 300 with a tapered gate manifold 302. The gate manifold 302 is stair-step tapered in width. Various tapers are possible. The gate finger widths and FET channel widths 304 are inversely tapered with respect to the gate manifold 304.

In particular, where the gate manifold 302 is at its widest, the FET channel 304 is at its narrowest. The FET channel 304 includes gate fingers 306 and source fingers 308 and drain fingers 310. The source and drain fingers 308, 310 are also tapered in width from the input to the output 350 such that they get narrower from the input to the output 350 of the FET structure 300. Tapering the width of the gate manifold 302, gate fingers 304, source finger 308, and drain fingers 310 is done in accordance with the present invention in order to achieve greatly improved high frequency performance from the FET structure 300. It is understood that the tapering can be achieved in a stair-step tapered format shown in FIG. 3 or can be done in a more smooth manner to achieve the substantially similar results. It is also understood that an exemplary FET structure is not limited to having four or less FET transistors incorporated therein. An exemplary FET structure having tapered width portions may have a plurality of transistors incorporated therein.

Figure 4:
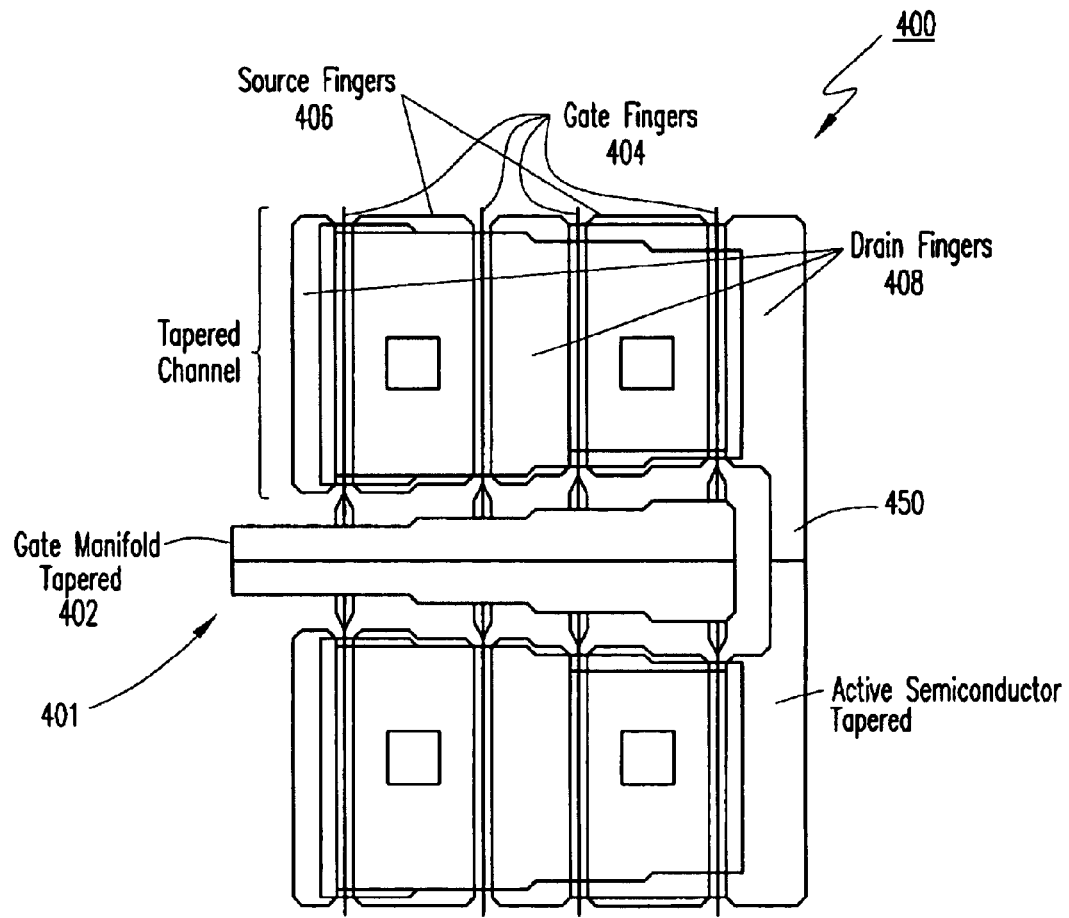
FIG. 4 is another embodiment of a reduced size FET structure in accordance with the present invention having a tapered gate manifold and the physical dimensions of the gate source and drain fingers constant at one end of the channel and tapered at a second end of the channel of the FET structure
Figure 5:
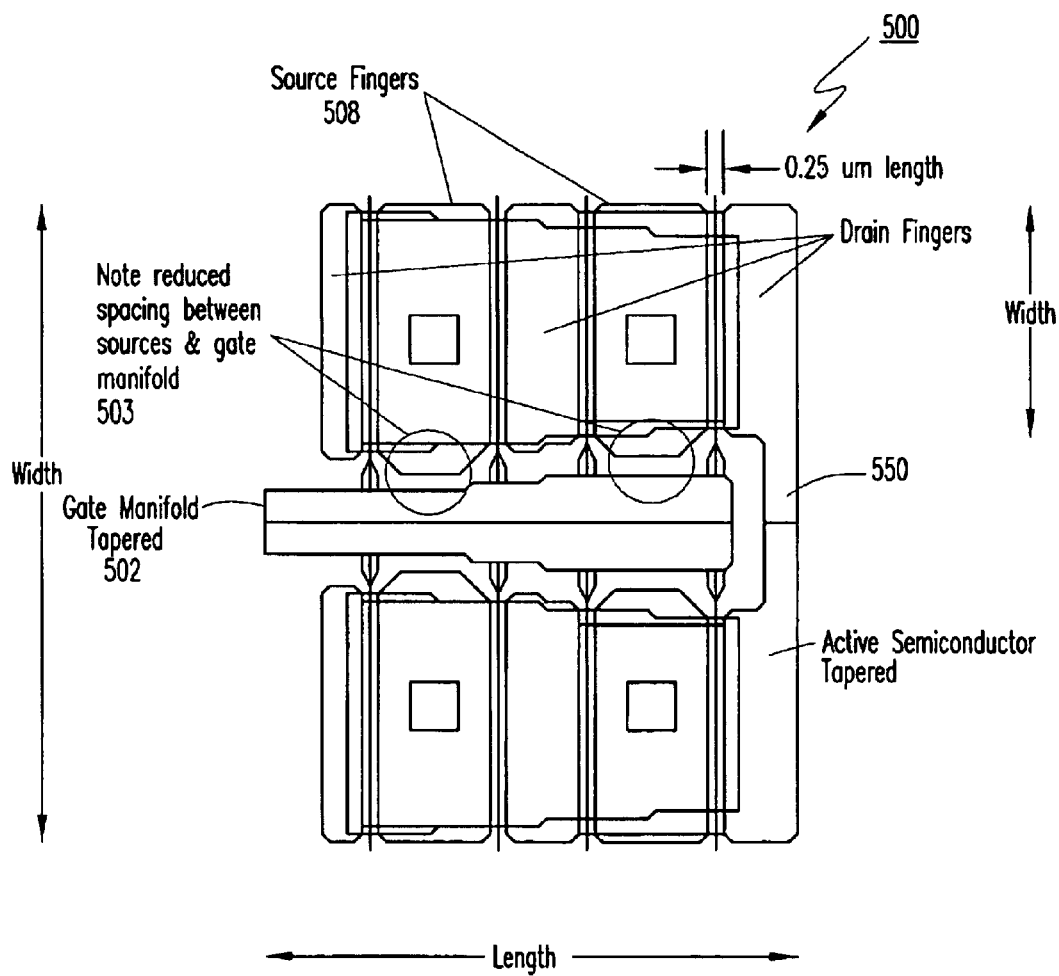
FIG. 5 is another embodiment of a reduced size FET structure in accordance with the present invention having a tapered gate feed bar and adjusts the impedance by changing the gate feed bar ground (source finger) spacing in addition to changing the gate bar width.

Referring now to FIGS. 3, 4, and 5; FIG. 3 depicts an exemplary FET structure 300 wherein the gate fingers 304, source fingers 308 and drain fingers 310 all decrease in width in a tapered fashion from the FET structure's input 302 to its output 350 FIG. 4 depicts an exemplary FET structure 400 wherein the gate manifold 402 is tapered in a stair-step-fashion from input 401 to output 450. The drain fingers 408 and source fingers 406 are not tapered at the upper and lower sides of the FET structure 400. The drain fingers 408 and source fingers 406 are tapered only on the gate manifold 402 side of each finger thereby adjusting their width. The gate fingers 404 may extend out past the active semiconductor region of the FET structure 400. The active semiconductor region (the region under the gate manifold 402 and the central portion of the FET structure 400) is tapered to coincide with the gate manifold tapering and the central portions of the source fingers 406 and drain fingers 408.

The exemplary embodiment depicted in FIG. 5 is similar to the embodiment depicted in FIG. 4, but the gate manifold 402, 502 is tapered less aggressively in the embodiment of FIG. 5. The impedance is adjusted by gate manifold to ground spacing 503 and by extending the source fingers 508 such that the spacing between the source fingers 508 and the gate manifold 502 is reduced. The extension of the source fingers 508 reduces the characteristic impedance of the gate manifold 502 and thereby reduces the amount of taper required in the gate manifold 502. Note that as a microstrip's line-to-ground spacing decreases, the characteristic impedance of the microstrip line also decreases Each of the FET channel widths in the exemplary FET structures 400 and 500 (FIGS. 4 and 5) are tapered (decreased in width) toward the output 450, 550 of the FET structure 400, 500. The FET channel width's taper is controlled by the active (conductive) semiconductor area widths of the FET channels. This is achieved by adjusting the dimensions, at the mask level, that controls the shape of the active semiconductor area, or controls the shape of the isolated (nonconductive) regions around the FET channel.

It is important to realize the performance difference on exemplary reduced size FET structure with a tapered gate feed (manifold) and a reduced size FET without a tapered gate feed. Again, an exemplary FET structure tapers one or both the gate feed bar (manifold) and the FET channel widths to achieve a higher gain and better operating frequency performance than previous reduced size FET structures. The effect of each exemplary taper change (gate manifold, channel width) can be studied separately. These effects are described below and then followed by a description exemplary FET structure performance that incorporates an overall exemplary FET structure.

The performance effect of tapering separate FET channel widths in a reduced size FET structure can best be shown by several simulation examples A standard prior art reduced size FET may contain 8 FET channels, and therefore 8 gate fingers, as shown in FIG. 2. The gate finger 202 widths in a standard reduced size FET structure 200 are all the same, for instance, 75 um for each gate finger. This would mean that the total gate finger width for this reduced size FET structure 202 is 8×75 um=600 um The gain of this 600 um reduced size FET structure 202 can be increased by 0.3–0.5 dB or more, at high frequencies, for the same total FET gate width, by tapering the gate finger widths down the gate feed line. For example, in an exemplary embodiment of the present invention, changing the gate finger widths to 80 um for the two gate fingers closest to the gate feed input (e.g. 301), to 77 um for the next pair of gate fingers; to 73 um for the next pair of gate fingers, and to 70 um for the last pair of gate fingers closest to the drain output (e g. 350) of the FET structure, the gain of this "tapered" gate width FET is 0.3 dB higher at 30 and 40 GHz, compared to that of the prior standard reduced size FET structure of FIG. 2

Tapering the reduced size FET structure's gate channel widths, and tapering the gate feed structure, allows the number of FET gate "stripes" to be increased at a given frequency, enabling higher total gate width and higher output power from the FET structure. Although 4-gate stripe (each "stripe" has two gate fingers) reduced size FETs as sketched in FIG. 2 are currently used in 30 GHz monolithic microwave integrated circuit (MMIC) amplifiers, the new exemplary gate feed manifold and tapered gate channel structures will allow 6-gate stripe FETs to be used in future 30 GHz MMIC power amplifiers. This will increase total FET gate width by 40% or more, with a resultant 40% increase in available output power from the amplifier.

The gate finger width taper of exemplary FET structures are easily achieved by controlling the channel width dimensions (the active area mask). The distance from each gate bar feed (manifold) to the active channel will usually be substantially the same, to keep from increasing FET gate resistance, Rg, the channel width will be adjusted, and gate metal stripes will normally be continuous (connected) when several FETs are placed in parallel.

Several reduced size 4-gate stripe, 8-gate finger FETs were modeled with both constant gate finger widths, and tapered gate finger widths, with the predicted maximum available gain results shown in Table 1.

TABLE 1

Simulated Performance Results for Reduced Size FETs
With and Without Tapered Channel Widths

| Width of Gate Fingers (um | | | | | | |
|---|---|---|---|---|---|---|
| Stripe 1 (near gate feed input) Fingers 1, 2 | Stripe 2 Fingers 3, 4 | Stripe 3 Fingers 5, 6 | Stripe 4 (near end of gate bar) Fingers 7, 8 | Total FET Gate Width (um) | Maximum Available Gain (dB) at 30 GHz / at 40 GHz | Upper Frequency Limit Increased by x GHz |
| 75 | 75 | 75 | 75 | 600 | 10.1 / 5.4 | 0 (reference) |
| 80 | 77 | 73 | 70 | 600 | 10.4 / 5.7 | +0.5 |
| 70 | 73 | 77 | 80 | 600 | 10.0 / 5.2 | −0.5 |
| 72.5 | 72.5 | 72.5 | 72.5 | 580 | 10.4 / 5.7 | +0.9 |
| 80 | 75 | 70 | 65 | 580 | 10.8 / 6.0 | +1.5 |
| 70 | 70 | 70 | 70 | 560 | 10.7 / 6.0 | +1.5 |

TABLE 1-continued

Simulated Performance Results for Reduced Size FETs
With and Without Tapered Channel Widths

| Width of Gate Fingers (um) | | | | | | | |
|---|---|---|---|---|---|---|---|
| Stripe 1 (near gate feed input) | Stripe 2 | Stripe 3 | Stripe 4 (near end of gate bar) | Total FET Gate | Maximum Available Gain (dB) | | Upper Frequency Limit |
| Fingers 1, 2 | Fingers 3, 4 | Fingers 5, 6 | Fingers 7, 8 | Width (um) | at 30 GHz | at 40 GHz | Increased by x GHz |
| 80 | 75 | 65 | 60 | 560 | 11.2 | 6.5 | +2.1 |
| 75 | 70 | 65 | 60 | 540 | 11.4 | 6.7 | +2.6 |

Exemplary FET channel width tapers are shown for the examples in Table 1. The model predictions show reduced size FET structures having increased gain using FET channel width tapers. For the two 560-um FET cases in Table 1, the tapered channel FET structure offers 0.5 dB higher gain, and 0.6 GHz higher frequency performance, than the FET structure with prior art constant channel widths One of the 600 um FET examples in Table 1 shows gate finger widths increasing toward the output (drain) of the FET (70 um at input, increasing to 80 um near the FET output), and this decreases FET gain, as expected. The overall FET channel width taper must decrease FET channel widths in moving from the FET gate feed input, to near the drain output of the FET, to achieve higher gain from the FET.

This demonstrates that reduced size FET gain can be increased by 0.3–0.5 dB or more, through use of FET channel width tapers. When combining this FET channel taper with a tapered gate feed bar, the reduced size FET gain can be increased by 1- to 2-dB and even 3-dB compared to standard reduced size FETs, and the upper operating frequency of the FET can be significantly increased. An increase in FET gain of 1 to 2 dB at 30 or 40 GHz is very significant in hybrid and MMIC amplifiers 30 to 40 GHz is a frequency range where transistor and amplifier gain in an integrated circuit is difficult to achieve. Most amplifiers cascade three or four FETs to achieve gain levels of 20 dB or more in the 30 GHz or higher frequency range. The exemplary gate feed manifold structure for reduced size FETs allows MMIC amplifiers to achieve at least 3 dB higher gain, at mm-wave frequencies, than amplifiers designed using non-tapered standard reduced size FETs The shape and characteristic impedance of the gate feed bar, also referred to as a gate manifold, is an important element of the overall exemplary FET structure. The gate feed bar is essentially a microstrip transmission line which is periodically loaded with gate fingers (FET channels). Each FET channel has an input impedance which can be modeled as a series resistor-capacitor (RC) circuit, to ground. The FET channels load the gate bar transmission line, causing both attenuation and an additional phase shift as an RF signal travels down the manifold. The attenuation and phase shift can be, at least, partially compensated for by changing the shape and characteristic impedance of the gate feed bar. Tapering the FET channel widths, in addition to tapering the gate feed bar, provides even better compensation, and results in an exemplary overall new FET structure.

Figure 6A:
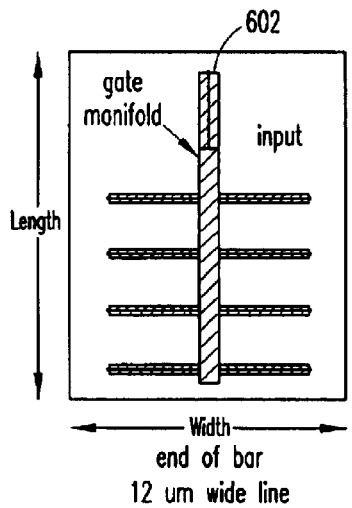
FIGS. 6A through F, these figures are exemplary layouts of tapered and untapered gate manifolds.
Figure 6B:
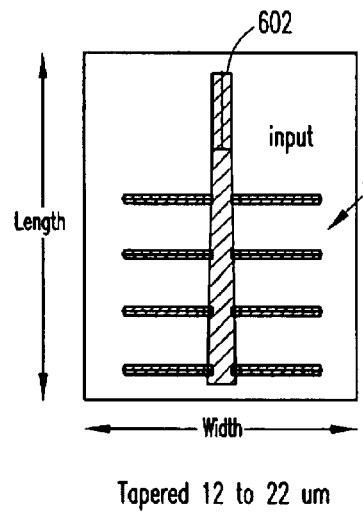
Figure 6C:
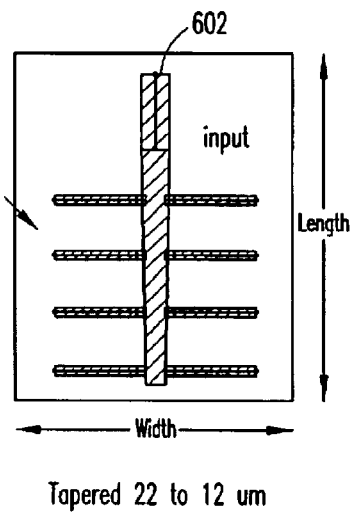
Figure 6D:
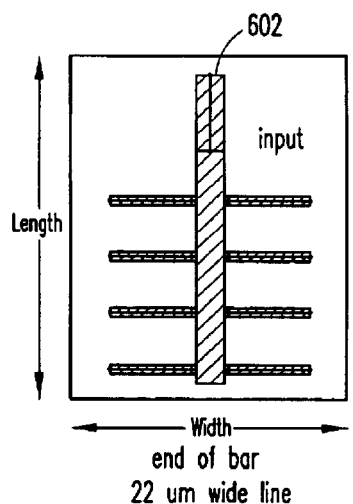
Figure 6E:
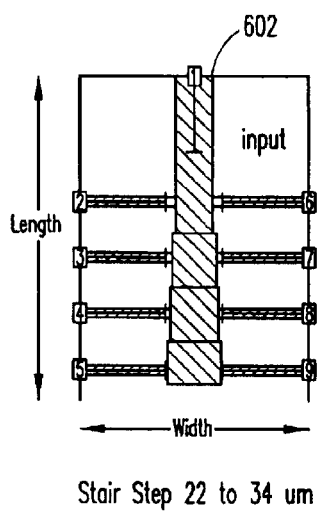
Figure 6F:
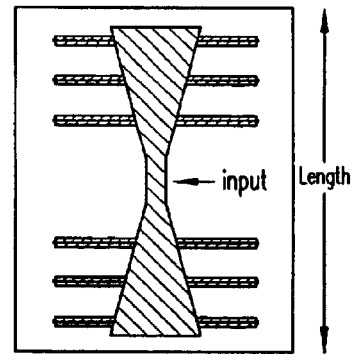

The gate feed bar can be either rectangular or tapered (linear, exponential, polynomial-various equations, or stepped width line) in shape. Several different gate manifolds have been simulated for FET performance A few examples of tapered gate manifolds are sketched in FIGS. 6A through 6F, and FET predicted performance for these manifolds 6A–6E is summarized in Table 2 Note that the input of FIG. 6F is positioned centrally in the FET structure with dual tapering gate manifolds Table 2 clearly shows that the maximum available gain of a reduced size FET with 500 um total gate width (all gate finger widths the same, 62.5 um) can be increased from 6 dB at 40 GHz for a standard rectangular gate manifold structure (FIG. 6A), to 7 dB at 40 GHz using a selected stair step taper in gate manifold line width (FIG. 6E). This 1 dB improvement in FET structure gain is achieved by increasing the gate manifold width as the RF signal travels down the gate manifold 602, the increased gate width lowers the characteristic impedance of the microstrip line

TABLE 2

Predicted Maximum Available Gain for 500 um Reduced Size FETs with Rectangular and Tapered Gate Manifolds

| | Gate Bar Shape and Width (um) | Maximum Available Gain (dB) at 40 GHz; 500-um FET total gate width (8 × 62.5 um) |
|---|---|---|
| 6A | Rectangular, 12 um wide line (std) | 6.0 |
| 6B | Tapered (linear), 12 um (gate input) to 22 um (end of gate bar) | 6.5 |
| 6C | Tapered (linear), 22 um (gate input) to 12 um (end of gate bar) | 6.4 |
| 6D | Rectangular, 22 um wide line | 6.8 |
| 6E | Tapered (stair step), 22 um (gate input) to 34 um (end of gate bar) | 7.0 |

An exemplary FET structure may have both a tapered gate manifold and tapered FET channel widths (see e.g., FIG. 3). Predicted performance for 560-um gate width reduced size FETs is shown for three cases in Table 3

Case 1. 4-gate stripe, 8-gate finger 560-um FET with 70-um gate finger widths, and a 12-um wide, rectangular gate manifold.

Case 2. 4-gate strip, 8-gate finger 560-um FET with 70-um gate finger widths, and a stair stepped gate manifold which increases in width from 20 um to 34 um in 4 urn increments, from gate feed input to the (wider) end of the gate feed bar.

Case 3. The 560-um FET in case 2 with the exemplary complete gate structure, which includes tapered FET channel widths. The channels widths for gate pairs, from gate feed input to the end of the gate bar, are 79 um, 73 um, 67 um, and 61 um. Total gate width is 2×(79+73+67+⊕um)= 560 um. This is similar to the exemplary reduced size FET structure 300 in FIG. 3

TABLE 3

Predicted maximum available gain and upper frequency range for three different 560-um gate width reduced size FETs, cases 1–3. See case 1–3 descriptions above

| 560-um FET, Case: | Max. Avail. Gain at 30 GHz (dB) | Max. Avail. Gain at 40 GHz (dB) | Frequency Where Gain Decreases to 3 dB (GHz) |
|---|---|---|---|
| Case 1. Std gate feed | 10.3 | 5.06 | 42.8 |
| Case 2. Tapered gate bar | 11.0 | 6.69 | 48.2 |
| Case 3. New gate feed (tapered bar and channels) | 11.3 | 6.93 | 49.0 |

Table 3 shows that the exemplary gate feed structure (case 3) increases the predicted upper frequency range for the 560-um gate width FET by 6.2 GHz, from 42.8 GHz (case 1) to 49 GHz, and the maximum available gain of the FET at 40 GHz is increased by 1.87 dB, nearly 2 dB. This is a significant improvement in FET performance, which is achieved using an exemplary FET structure, with only a small impact on overall FET area.

Still referring to the 560-um FET structures for Table 3, the widths of the FETs for cases 2 and 3 are within 4 um of each other. These widths could be adjusted to be the same. The case 2 and 3 FET widths slightly larger and can be set within 10 um or less than the case 1 FET, a small increase (<10%) in overall FET area and cost. This small increase in overall FET area and cost is well offset by the significant performance improvement provided the reduced size FET with the new gate feed structure at mm-wave frequencies in accordance with the present invention.

As discussed, prior FET structures that were designed to be distributed amplifiers had a drawback of when RF energy travels down a rectangular gate feed structure, it is attenuated. There is also a resulting phase shift or difference between the wave (field) entering the FET gate feed and the wave at the end of the FET gate feed. The attenuation and phase shift degrades the overall performance of the distributed amplifier at high frequencies.

The exemplary tapered gate finger widths help to compensate for attenuation and phase differences and thereby increase and improve the performance of an exemplary FET structure over prior distributed FELT structures.

Furthermore, in various FET structures, capacitive voltage dividers are utilized in high power distributed amplifiers or transistors to help equalize gate voltages at FET stages and to increase the overall amplifier bandwidth. Prior devices utilize a MIM capacitor, placed in series with the FET gate. The FET gate provides the other capacitor (Cgs) in the voltage divider circuit (see FIG. 1). The MIM capacitors, of these prior devices, are relatively small in value, and are increased in value (in a tapered fashion) as they are used toward the output of the distributed amplifier. The RF signal decreases as it travels down the distributed amplifier gate manifold and larger MIM caps are incorporated into each FET divider circuit in order to allow more of the signal to reach the output side of the FET distributed amplifier.

Embodiments of the present FET structure invention do not require the addition of MIM capacitors in order to achieve improved performance over prior high power, high frequency distributed FET amplifiers. The tapering of the gate finger widths of exemplary FET structures such that they are shorter toward the output of the FET structure decreases the Cgs of each gate finger and can substantially eliminate the need for the inclusion of MIM capacitors into the design As will be recognized by those skilled in the art, the innovative concepts described herein can be modified and varied over a wide range of applications, which include, but are not limited to FETs and BJTs. Accordingly, the scope of patented subject matter should not be limited to any of the specific exemplary teachings discussed, but is instead defined by the following claims

What is claimed is:

1. A field effect transistor (PET) structure comprising:
   a tapered gate manifold being tapered such that a width of said gate manifold changes incrementally over said gate manifold's active length said tapered gate manifold having an input and
   a plurality of gate fingers extending substantially perpendicular to a centerline of said tapered gate manifold.

2. The FET structure of claim 1, wherein said plurality of gate fingers decrease in width as they are distal from said input.

3. The PET structure of claim 1, further comprising a tapered channel width associated with said tapered gate manifold.

4. The FET structure of claim 1, wherein said tapered gate manifold is tapered in a stair-step fashion at least along one side of said tapered gate manifold.

5. The FET structure of claim 1, wherein the width of said tapered gate manifold increases incrementally from said input and along the length of said tapered gate manifold.

6. The FET structure of claim 1, wherein said tapered gate manifold has a width of greater than about 7 um and less than about 40 um over said gate manifolds length.

7. The PET structure of claim 1, further comprising a plurality of drain fingers and source fingers interspersed between said gate fingers.

8. The FET structure of claim 7, wherein said plurality of drain fingers and source fingers are narrower as they are distal from said input.

9. A FET structure comprising:
   a gate manifold having an input portion and a distal portion;
   a plurality of gate fingers extending substantially perpendicular to a center line of said gate manifold, said plurality of gate fingers decreasing in width as said they are distally positioned from said input portion.

10. The FET structure of claim 9, wherein said gate manifold has a width that increases from said input portion to said distal portion.

11. The FET structure of claim 9, wherein said gate manifold is tapered from said input portion to said distal portion.

12. The FET structure of claim 9, further comprising a tapered active channel associated with said gate manifold and said plurality of gate fingers.

13. The FET structure of claim 9, wherein said gate manifold is tapered in a stepped manner from said input portion to said distal portion.

14. The FET structure of claim 13, wherein said gate manifold is narrower at said input portion than at said distal portion.

15. The FET structure of claim 9, further comprising:
   plurality of source fingers; and
   plurality of drain fingers, said plurality of source fingers and said plurality of drain fingers being positioned in an alternating manner between said gate fingers.

16. The FET structure of claim 15, wherein the width of said plurality of source fingers decreases as the source fingers are positioned distally from said input portion.

17. The FET structure of claim 15, wherein the width of each one of said plurality of source fingers decreases in a tapered manner as the source fingers are positioned distally from said input portion.

18. The FET structure of claim 15, wherein the combination of said plurality of source fingers and said plurality of drain fingers decrease in width as they are distally positioned from said input portion.

19. A FET structure comprising:
   a tapered gate manifold having an input portion and a distal portion, said tapered gate manifold having a width that changes incrementally over the active length of said tapered gate manifold;

a gate finger extending perpendicular from a center line of said tapered gate manifold;

a source finger positioned on a first side of said gate finger; and a drain finger positioned on a second side of said gate finger.

20. The FET structure of claim 19, wherein said tapered gate manifold is tapered in a stepped manner.

21. The FET structure of claim 19, wherein said FET structure is a part of a monolithic microwave integrated circuit (MMIC).

22. The FET structure of claim 19, wherein said tapered gate manifold is narrower at an input portion of said tapered gate manifold and wider at a distal portion of said tapered gate manifold.

23. The FET structure of claim 19, further comprising an active channel associated with said tapered gate manifold, said active channel being tapered along the length of the gate manifold.

24. An integrated circuit comprising:

a FET structure, said FET structure comprising:

a gate manifold having an input portion, and a plurality of gate fingers, said plurality of gate fingers extending from said gate manifold, said plurality of gate fingers becoming shorter as they are positioned distally from said gate manifold input portion.

25. The integrated circuit of claim 24, wherein said gate manifold increases in width as it extends distally from said input portion.

26. The integrated circuit of claim 24, wherein said FET structure further comprises;

a plurality of source fingers positioned next to and on a first side of each one of said plurality of gate fingers, said plurality of source fingers being narrower in width as they are more distal from said input portion.

* * * * *